United States Patent [19]
Kaneko et al.

[11] Patent Number: 5,532,508
[45] Date of Patent: Jul. 2, 1996

[54] SEMICONDUCTOR DEVICE WITH LDD STRUCTURE

[75] Inventors: Seiji Kaneko, Joyo; Tomoya Baba, Nara, both of Japan

[73] Assignee: Sharp Kabushiki Kaisha, Osaka, Japan

[21] Appl. No.: 445,018

[22] Filed: May 22, 1995

Related U.S. Application Data

[62] Division of Ser. No. 215,604, Mar. 22, 1994, Pat. No. 5,426,063.

[30] Foreign Application Priority Data

Mar. 24, 1993 [JP] Japan ................................. 5-65285

[51] Int. Cl.$^6$ ............................ H01L 29/76; H01L 29/94
[52] U.S. Cl. ........................ 257/336; 257/344; 257/404; 257/408; 257/607
[58] Field of Search ................................. 257/408, 344, 257/336, 607, 404

[56] References Cited

U.S. PATENT DOCUMENTS

| | | | |
|---|---|---|---|
| Re. 32,800 | 12/1988 | Han et al. ................... | 437/27 |
| 4,649,629 | 3/1987 | Miller et al. .............. | 29/576 B |
| 5,147,811 | 9/1992 | Sakagami ................... | 437/35 |
| 5,218,221 | 6/1993 | Okumura ..................... | 257/336 |
| 5,320,974 | 6/1994 | Hori et al. ................. | 437/44 |

FOREIGN PATENT DOCUMENTS

| | | |
|---|---|---|
| 3-262130 | 11/1991 | Japan . |
| 5-129217 | 5/1993 | Japan ................... 437/35 |

*Primary Examiner*—William Mintel
*Attorney, Agent, or Firm*—Nixon & Vanderhye

[57] ABSTRACT

A method for manufacturing a semiconductor device including steps of forming a gate oxide film and a gate electrode on a semiconductor substrate; implanting impurity ions of the same conductivity as the substrate in an oblique direction at a first tilt angle to the normal line of the substrate and with a first acceleration voltage and dose, while rotating the substrate about the normal line thereof; implanting impurities of the same conductivity as the substrate in the same manner except for using a tilt angle to the normal line which is greater and a dose which is smaller than that of the first tilt angle and dose; and forming source and drain regions by implanting impurity ions of the opposite conductivity to the substrate into the substrate, followed by performing a thermal treatment.

3 Claims, 7 Drawing Sheets

(a)

(b)

(c)

(d)

SEMICONDUCTOR DEVICE WITH LDD STRUCTURE

This is a divisional of application Ser. No. 08/215,604, filed Mar. 22, 1994, now U.S. Pat. No. 5,426,063.

BACKGROUND OF THE INVENTION

1. Field of the Invention

The invention relates to a semiconductor device and a method for manufacturing the same. In particular, it relates to a structure of a field effect transistor having a submicron channel length and a manufacturing method for the same.

2. Description of the Related Art

A conventional field effect transistor having a submicron channel length (for example, MOS transistor including those with an LDD structure) has a drawback in that a threshold voltage and a source/drain breakdown voltage are lowered owing to a short channel effect. It causes a strict limitation for minimizing the size of a semiconductor device. In order to overcome the drawback, a method disclosed in U.S. Pat. No. 5,218,221 to Okumura (corresponding to Japanese Laid-Open Patent Application 3(1991)-204940) was developed, in which impurity ions are implanted at a predetermined tilt angle to the normal line of the semiconductor substrate, while rotating the substrate about the normal line thereof.

According to the above method, a device can be formed with a channel in which impurity ions are unevenly implanted. More specifically, the impurity concentration distribution in the vicinity of source and drain of the channel is locally higher than the center region thereof. Therefore, a threshold voltage of the device can be controlled. In addition, since this impurity ion implantation inhibits an extension of a depletion layer between the source and drain, the control of the breakdown voltage is also improved.

The inventors of the present invention measured a short channel effect by implanting impurity ions for controlling the threshold voltage in an oblique direction at 30°. The results are shown in FIG. 10. As is seen from FIG. 10, the decrease of the threshold voltage (Vth) is improved when impurity ions are implanted in a higher dose.

Similarly, FIG. 11 shows a short channel effect by implanting impurity ions for controlling source/drain breakdown voltage in an oblique direction at 7°, which is a different tilt angle from that of the above measurement shown in FIG. 10.

It can be seen that the implantation at an angle of 30° improves the decrease of the threshold voltage more effectively than the case of implantion at an angle of 7°.

As shown in FIG. 14, the conventional example shows implanting impurity ions at 30° with a concentration of $7 \times 10^{12}$ ions/cm$^2$, and the voltage abruptly goes down when having a short channel length, for example shorter than 0.5 µm. However, even when implanting impurity ions at the same angle used for FIG. 11, such a lowering of the voltage does not occur in a short channel region if the implantation is conducted with $1 \times 10^{13}$ ions/cm$^2$.

As is apparent from FIGS. 10 and 11, the preferred dose of ion implantation for controlling threshold voltage is different from that for controlling the source/drain breakdown voltage.

However, according to the method described above, as p level ions are implanted at one type of concentration by the oblique ion implantation, only the ion impurity region 11 is formed as shown in a cross sectional view of a conventional semiconductor in FIG. 16. Therefore, it was not possible to satisfy the two conditions simultaneously i.e., a condition for controlling the short channel effect and a condition for improving the breakdown voltage by inhibiting the extension of the depletion layer between the source and drain, in order to obtain the preferred condition for improving the conventional defect.

SUMMARY OF THE INVENTION

The present invention provides a method for manufacturing a semiconductor device comprising the steps of:
(a) forming a gate oxide film and a gate electrode on a semiconductor substrate;
(b) subjecting the resulting substrate to the following steps in either order of,
   i) implanting impurity ions of the same conductivity as the substrate in an oblique direction at a first tilt angle to the normal line of the substrate and with a acceleration voltage and dose, while rotating the substrate about the normal line,
   ii) implanting impurity ions of the same conductivity as the substrate in an oblique direction at a second tilt angle to the normal line of the substrate which is greater than the angle of the step (b)-i), with a dose and an acceleration voltage, while rotating the substrate about the normal line thereof; and
(c) forming source and drain regions by implanting impurity ions of the opposite conductivity to the substrate using the gate electrode as a mask, followed by performing a thermal treatment.

The present invention also provides a semiconductor device comprising an MOS type field effect transistor comprising:
   a semiconductor substrate having a gate oxide film and a gate electrode thereon;
   source and drain regions formed on opposite sides of a channel region; and
   plural pairs of impurity ion implanted regions provided under the gate electrode, and having the same conductivity as the substrate, which comprises:
      a first pair of impurity ion implanted regions; and
      a second pair of impurity ion implanted regions provided in a position deeper than the first pair of impurity ion implanted regions and equal to or shallower than the depth of source/drain region.

DETAILED DESCRIPTION OF THE PREFERRED EMBODIMENT

The method for manufacturing a semiconductor device of the present invention is described as follows.

Figure 1:
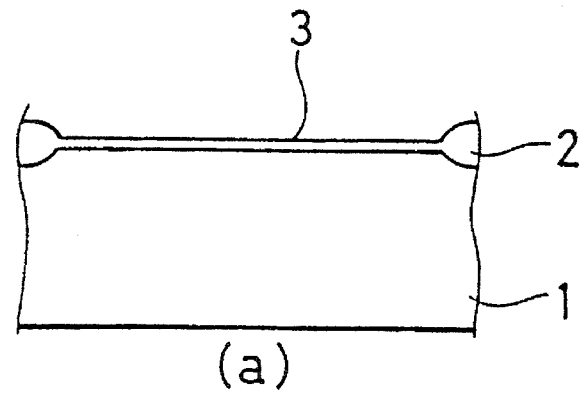
FIGS. 1 to 7 show manufacturing steps for a semiconductor device of an embodiment of the present invention.

First, as shown in FIG. 1, a gate oxide film 3 is formed on an active region of a semiconductor substrate 1 of P or N type. The active region may be defined by an isolation region 2, for example, by using a LOCOS method. In that case, if a channel length is 0.5 μm, the preferred thickness of the gate oxide film is 10 to 13 nm.

Figure 2:
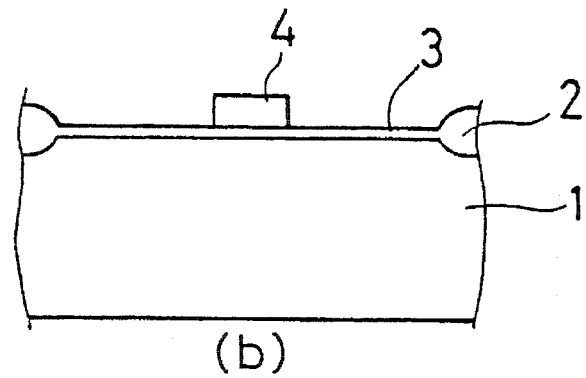

Then, as shown in FIG. 2, a polysilicon film is formed on the gate oxide film by depositing a polysilicon single layer by a method such as the polysilicon low pressure CVD method, or by depositing silicide of a refractory metal and polysilicon or polycide of a refractory metal and silicide by the low pressure CVD or sputtering method, to which photoetching is applied to form a gate electrode 4.

Next, impurity ions having the opposite conductivity to the substrate are implanted in the gate electrode in order to enhance the conductivity of the gate electrode. For example, phosphorous ions or arsenic ions are employed as N type impurity ions, and boron ions are employed as P type impurity ions. Accordingly, the threshold voltage is reduced by a difference in work functions between the gate electrode having the opposite conductivity to the substrate and a channel region having the same conductivity as the semiconductor substrate, and by an opposite conductivity ion diffusion toward a channel which is caused by a subsequent thermal treatment.

As a result, it would be necessary to raise the threshold value by forming an ion implanted region with impurity ions having the same conductivity as the substrate as shown in the following step.

Figure 3:
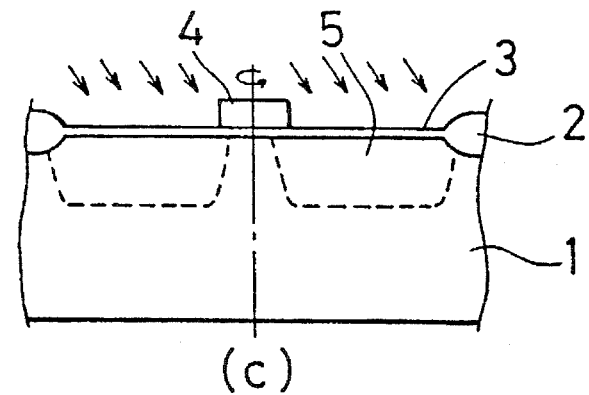

Subsequently, as shown in FIG. 3 a first impurity ion implantation is conducted. Impurity ions having the same conductivity as the semiconductor substrate are implanted all over the surface of the substrate in an oblique direction at a first tilt angle to the normal line of the substrate, while rotating the substrate about the normal line, thereby forming a first ion implanted layer 5 for controlling source/drain breakdown voltage. In case of the implantation, the gate electrode is used as a mask.

Figure 8:
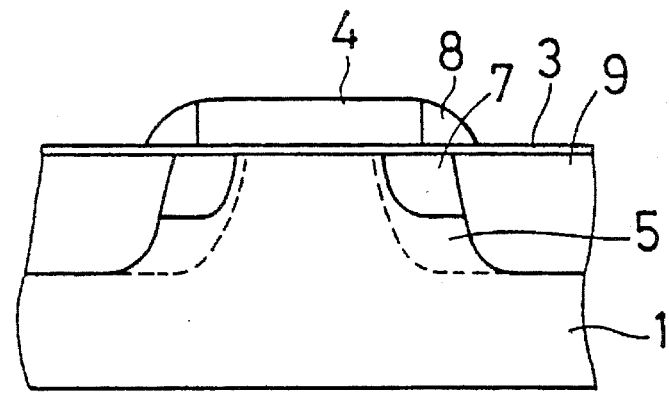
FIG. 8 shows the preferred position of ion implantation for controlling the source/drain breakdown voltage.

For the first ion implantation described above, the preferred tilt angle is about 7° to 20°. When the angle is less than 7°, ions are deeply implanted in the substrate because of channeling. As a result, the first impurity ion implanted layer 5 having the same conductivity as the substrate can not be provided in a preferred position for controlling the source/drain breakdown voltage. The reference numeral 5 in FIG. 8 shows the preferred position of the first impurity ion implanted layer 5 for controlling the source/drain breakdown voltage. On the other hand, when the angle is more than 20°, the first impurity ion implanted layer 5 adversely affects the channel region, which results in a difficulty for controlling the threshold voltage.

The acceleration voltage of the first ion implantation is preferably from about 40 to 90 KeV. When the voltage is out of this range, the first implantation can not be made to a preferred position. Particularly, if the acceleration voltage is less than about 40 KeV, the first impurity ion implanted layer 5 can not be provided in a position deeper than a third impurity ion implanted layer denoted by 7 in FIG. 8 to which impurity ions of the opposite conductivity to the substrate are implanted for forming the device with an LDD structure in a later step described hereinafter. On the other hand, when the voltage is more than 90 KeV, the implantation is made in a position deeper than a fourth impurity ion implanted layer denoted by 9 in FIG. 8 to which impurity ions of the opposite conductivity to the substrate are implanted for forming the source and drain regions in a later step, so that the junction region of the source and drain regions with the semiconductor substrate is increased, thereby lowering a breakdown voltage of junction region between source/drain region and the semiconductor substrate. In addition, since the ion concentration in the channel region is affected by implanting impurity ions from the side of the gate electrode, the threshold value of the device is hard to control.

Figure 11:
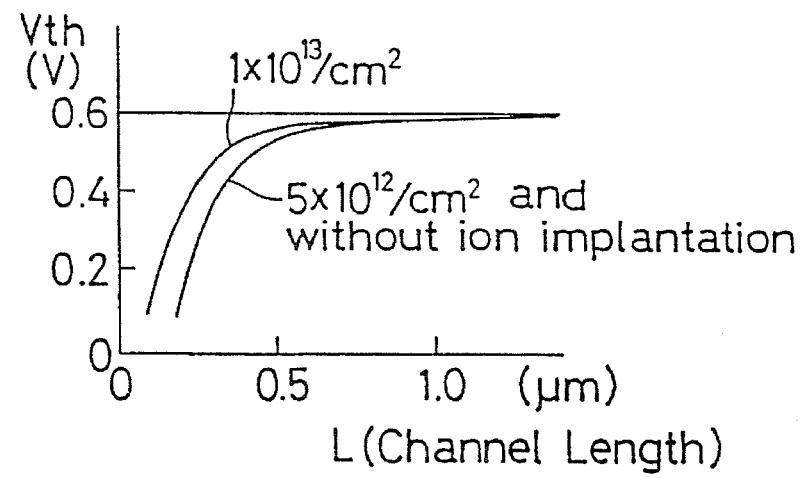
FIG. 11 schematically shows the short channel effect by the ion implantation for controlling the source/drain breakdown voltage.
Figure 12:
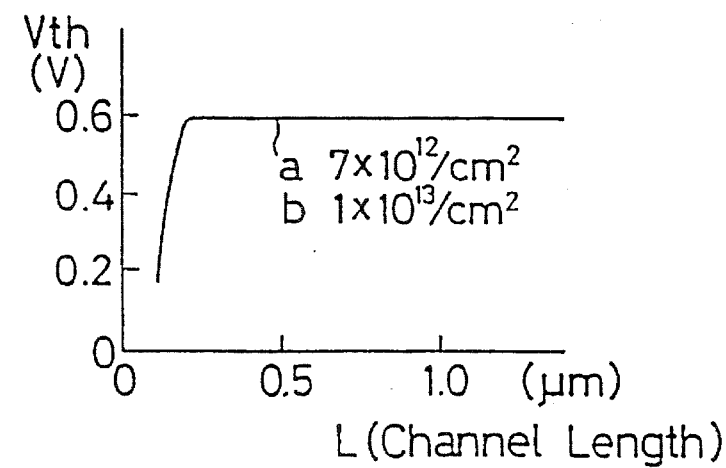
FIG. 12 schematically shows the short channel effect of the present invention when the impurity ions are implanted with a dose of $7 \times 10^{12}$ for controlling threshold voltage and of $1×10^{13}$ ions/cm$^2$ for controlling source/drain breakdown voltage.
Figure 13:
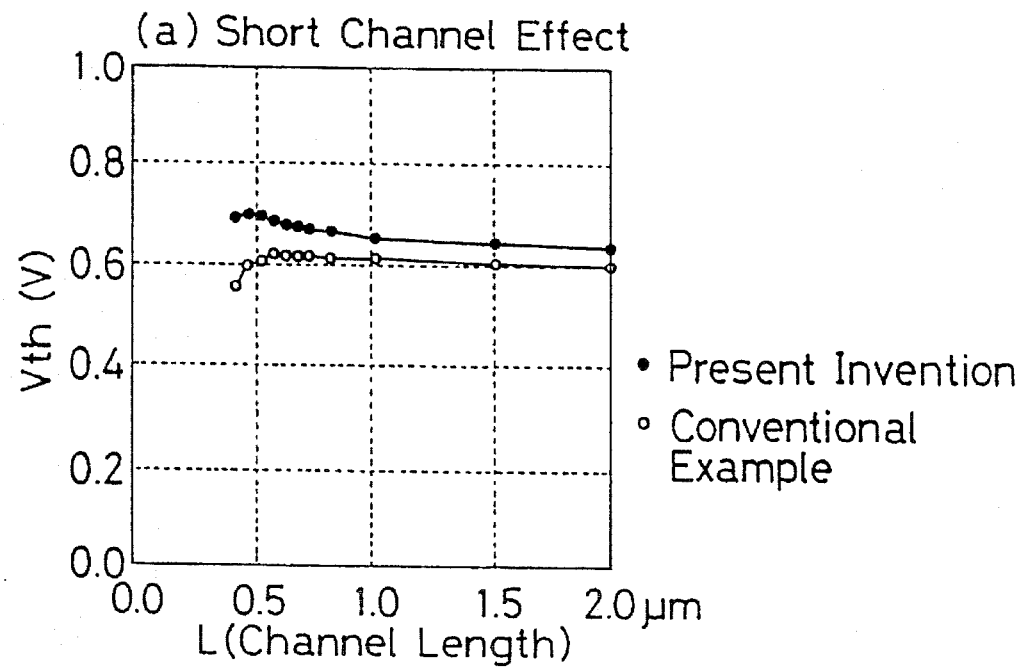
FIG. 13 shows the change of short channel effect in case of applying the method for the present invention, and the short channel effect in case of performing only conventional ion implantation for controlling the threshold voltage.
Figure 14:
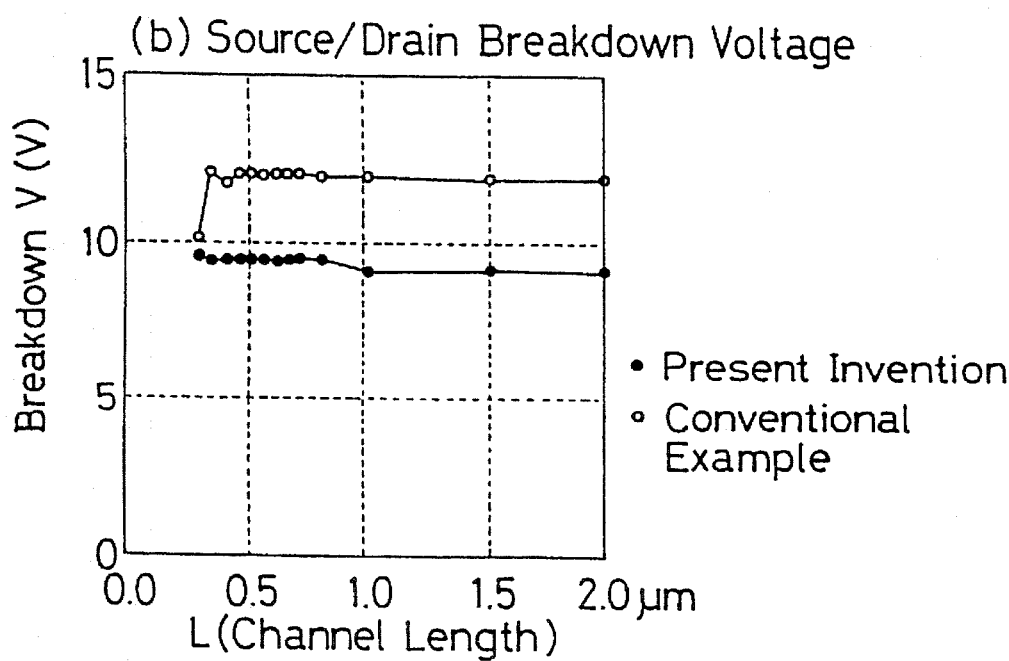
FIG. 14 shows the change of breakdown voltage in case of applying the method for the present invention, and the breakdown voltage in case of performing only conventional ion implantation for controlling the threshold voltage.

The preferred dose of impurity ions for the first impurity ion implantation is about 6 to $10×10^{12}$ ions/cm$^2$, which is a preferred value for controlling the source/drain breakdown voltage as shown in FIG. 11.

As shown in FIG. 8, impurity ions are preferably implanted to the depth which is equal to or less than that of the source and drain regions. If the ions are implanted deeper than the source/drain region, a region having a concentration higher than the substrate is formed underneath the source/drain, thereby lowering the source/drain breakdown voltage.

Figure 4:
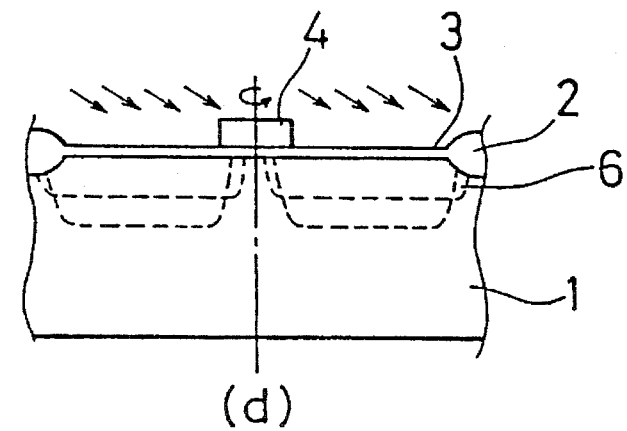

Next, as shown in FIG. 4 a second impurity ion implantation is conducted. Impurity ions having the same conductivity as the semiconductor substrate are implanted in an oblique direction at a second tilt angle to the normal line of the substrate greater than the first impurity ion implantation, while rotating the substrate as described above, thereby forming a second ion implanted layer 6 for controlling threshold voltage.

For the second impurity ion implantation, the preferred tilt angle is about 30° to 60°. When the angle is less than about 30°, a region having the same conductivity as the substrate is not provided over the third impurity ion implanted layer 7 to be formed for an LDD structure. On the other hand when the angle is greater than about 60° the second impurity ion implanted layer 6 can not be provided in a preferred position which is shown in FIG. 9, and the second impurity ion implanted layer 6 extends over the gate length in the case of a gate length of half micron or less.

The acceleration voltage for the second ion implantation is preferably from about 40 to 80 KeV. When the energy is less than about 40 KeV, the above channel region can not be provided. On the other hand, when the energy is more than about 80 KeV, the distribution width of the second impurity ion implanted layer extends over the gate length when the gate electrode has a width of 0.4 μm or less.

Figure 10:
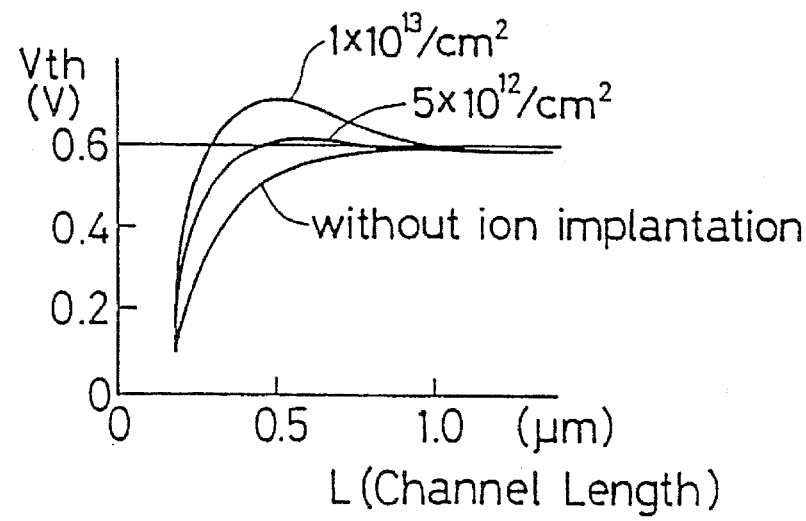
FIG. 10 schematically shows the short channel effect by the ion implantation for controlling the threshold voltage.

The preferable dose of the second ion implantation is about 2 to $7×10^{12}$ ions/cm$^2$ which is a preferred range for controlling threshold voltage as shown in FIG. 10.

Figure 9:
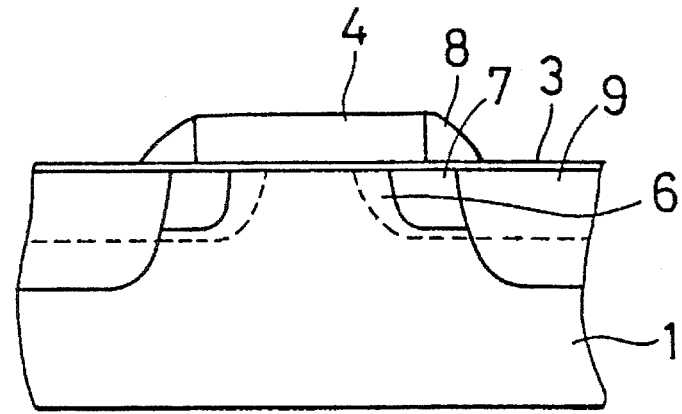
FIG. 9 shows the preferred position of ion implantation for controlling the threshold voltage.

The impurity ions for controlling the threshold voltage are preferably implanted to the depth equal to or shallower than the channel region provided between source and drain regions, or than the channel region provided between lightly doped source and drain regions in case of forming the device with LDD structure (see FIG. 9).

Figure 5:
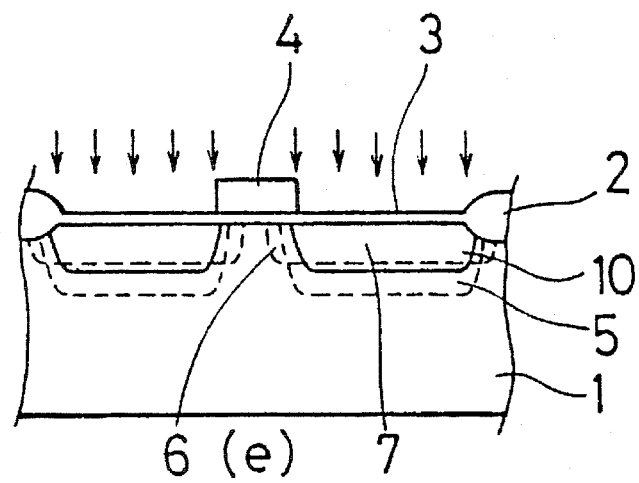

As described above, impurity ions of the same conductivity as the substrate are doubly implanted by the first and second impurity ion implantations in the region where the third impurity ion implanted layer 7 which is implanted as shown in FIG. 5. with impurity ions of the opposite conductivity to the substrate is provided in the case of forming the device with an LDD structure for releasing the intensity of the electric field in the channel region. Accordingly, it is necessary to determine the dose of the first ion implantation for controlling the breakdown voltage and the second ion implantation for controlling threshold voltage, respectively such that the total dose for first and second implantation of impurity ions of the same conductivity as the substrate does not exceed the dose for the impurity ions of the opposite conductivity to the substrate to be formed for an LDD structure.

Figure 7:
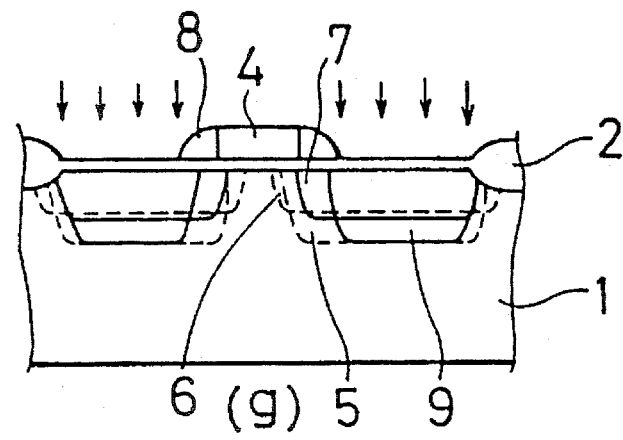

Finally, as shown in FIG. 7 the source and drain regions are formed. Impurity ions having the opposite conductivity to the semiconductor substrate are implanted all over the surface of the substrate in the direction of the normal line of the substrate using the gate electrode as a mask to form the fourth impurity ion implanted layer 9. Subsequently, the fourth impurity ion implanted layer 9 is activated by a thermal treatment, for example at 900° C. for 20 minutes, thereby forming an impurity ion diffusion layer working as the source and drain region.

Figure 6:
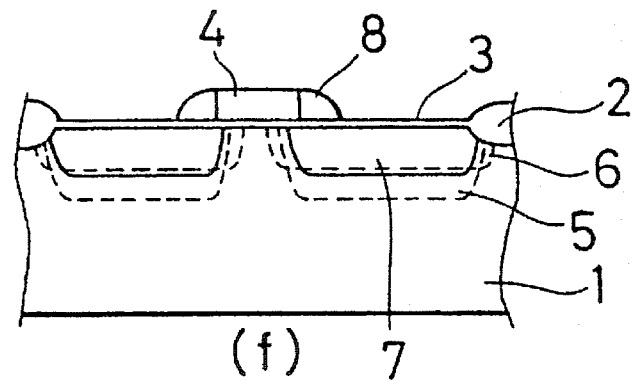

In the case of forming the source/drain region as an LDD structure, the following steps are conducted before implanting impurity ions for forming the fourth impurity ion implanted layer 9. First, impurity ions of the same conductivity to the semiconductor substrate are implanted in the same manner as described above except for a dose and acceleration voltage to form the third impurity ion implanted layer 7. Subsequently, silicon oxide film is deposited all over the surface of the semiconductor substrate by a CVD method and the like, and a side wall as shown in FIG. 6 is then formed on the side of the gate electrode by an anisotropic etching. After that, the fourth impurity ion impurity layer 9 is formed by implanting impurity ions having a conductivity opposite to the semiconductor substrate as described above. Next, the third and fourth impurity ion implanted layers 7 and 9 are activated by a thermal treatment, thereby forming an impurity ion diffusion layer working as the source and drain region.

The dose of the impurity ions and acceleration voltage for the third impurity ion implanted layer 7 for forming the LDD structure is set to be sufficiently lower than the impurity concentration of the fourth ion implanted layer 9.

The channel region of the obtained semiconductor device includes a plurality of pairs of impurity ion implanted regions which are provided under the gate electrode and have the same conductivity as the substrate. FIG. 4 shows that the impurity ion implanted regions on the both inner sides of the channel region are separated with from each other in the channel region.

According to the present invention, the plurality of pairs of impurity ion implanted regions comprises: a first pair of impurity ion implanted regions 6 and a second pair of impurity ion implanted regions 5 provided in a position deeper than the first pair of impurity ion implanted regions and equal to or shallower than the depth of source/drain region and having an impurity ion concentration greater than the first pair of impurity ion implanted regions; the first and the second pair of impurity ion implanted regions having a conductivity greater than the substrate.

Figure 15:
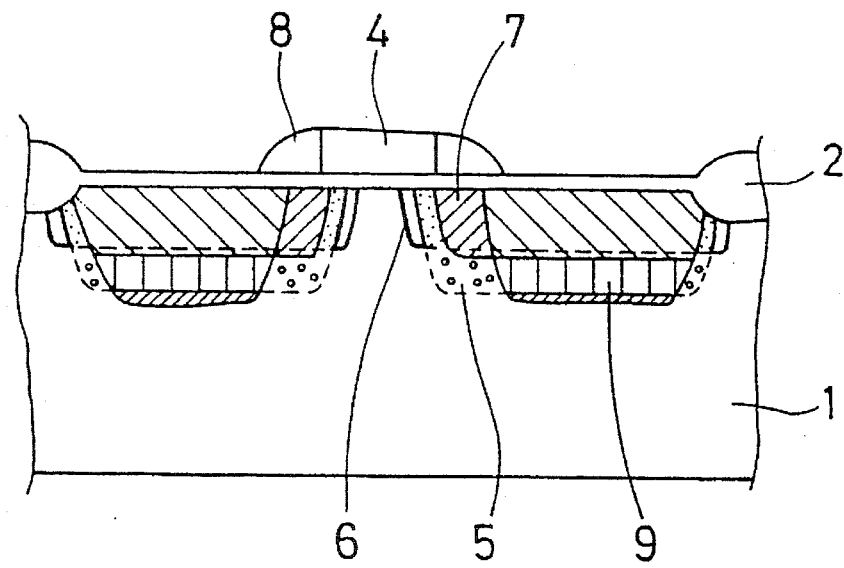
FIG. 15 shows a semiconductor device of the present invention.
Figure 16:
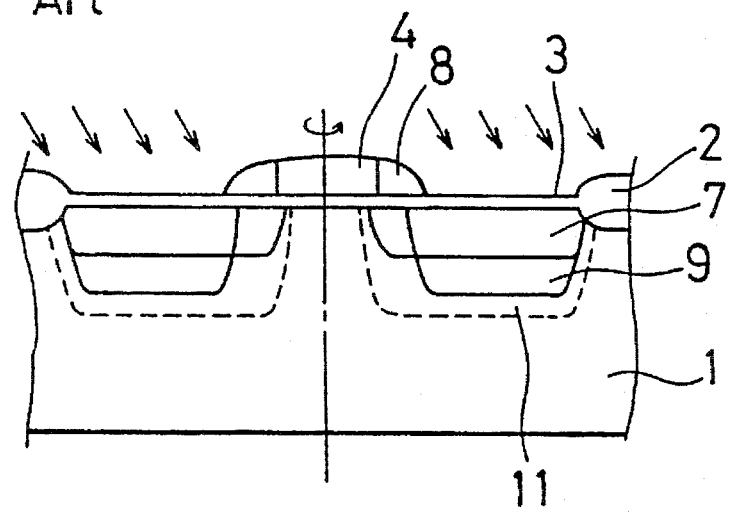
FIG. 16 shows a conventional semiconductor device.

As described above, the concentration distribution of the implanted impurity ions of the opposite conductivity to the substrate is gradually reduced in a vertical direction from the surface of the substrate to the bottom of the source and drain regions, and the concentration distribution of the implanted impurity ions of the same conductivity as the substrate is gradually reduced in a horizontal direction from the source and drain regions towards the center of the channel region, respectively (see FIG. 15).

Both of P type and N type conductivity of semiconductor substrates may be used as the substrate of the present invention. When an N type substrate is employed, an N type impurity ion implantation is conducted for implanting impurity ions for controlling the source/drain breakdown voltage and for controlling the threshold voltage, and a P type impurity ion implantation is conducted for implanting impurity ions for forming an LDD structure and for source/drain regions. Alternatively, when a P type substrate is employed, a P type impurity ion implantation is conducted for implanting impurity ions for controlling the source/drain breakdown voltage and for controlling the threshold voltage, and an N type impurity ion implantation is conducted for implanting impurity ions for forming LDD structure and for forming the ion implanted layer for source/drain region.

The manufacturing method for the present invention may be applied to a device with which a well is provided in a predetermined depth from the surface of the substrate.

According to the method for the present invention, the order of manufacturing steps may be alternated. For example, the implantation of impurity ions of the same conductivity as the substrate for controlling the source/drain breakdown voltage may be conducted after implanting impurity ions for controlling the threshold voltage, and the implantation of impurity ions of the same conductivity as the substrate may be conducted before implanting impurity ions of the opposite conductivity to the substrate for forming source and drain regions. When a device is formed with an LDD structure, the impurity ion implantations for controlling the threshold voltage and for controlling the source/drain breakdown voltage may be conducted between the step of implanting impurity ions having the opposite conductivity to the substrate for an LDD structure and the step of forming the side wall.

EXAMPLE 1

An example of the manufacturing method for the present invention is described with reference to FIG. 1 to FIG. 7. In FIGS. 1 to 7, reference numeral 1 denotes a P type silicon substrate, 2 denotes a device isolation region, 3 denotes a gate oxide film, 4 denotes a gate electrode, 5 denotes a first impurity ion implanted layer implanted with P type impurity ions for controlling the source/drain breakdown voltage, 6 denotes a second impurity ion implanted layer implanted with P type impurity ions for controlling the threshold voltage between the source and drain, 7 denotes a third impurity ion implanted layer implanted with N type impurity ions for forming a LDD structure, 8 denotes a side wall, and 9 denotes a fourth impurity ion implanted layer implanted with N type impurity ions for forming source and drain regions.

First, as shown in FIG. 1, a gate oxide film 3 having a thickness of about 110 angstroms was formed in an active region defined by a device isolation region 2 which is formed on a silicon substrate 1 by a LOCOS method.

After that, as shown in FIG. 2, a gate electrode 4 was formed by depositing polisilicon film with a thickness of 1500 angstroms and WSi with a thickness of 2000 angstroms all over the surface of the gate oxide film 3 by a polysilicon reduced CVD method, followed by photoetching. N type impurity ions were implanted to the gate electrode 4 such that the gate electrode 4 has a conductivity opposite to the substrate 1.

Then, boron ions were implanted as impurity ions all over the surface of the substrate 1 with an acceleration voltage of about 80 KeV in a dose of $1 \times 10^{13}$ ions/cm$^2$ in an oblique direction at a tilt angle of 7° to the normal line of the gate electrode 4, while rotating the substrate 1 about the normal line using the gate electrode 4 as a mask, thereby forming the P type first impurity ion implanted layer 5 for controlling the source/drain breakdown voltage (see FIG. 3).

Next, boron ions were implanted to the substrate 1 with an acceleration voltage of about 55 KeV in a dose of $7 \times 10^{12}$ ions/cm$^2$ in an oblique direction at a tilt angle of 30° to the normal line of the gate electrode 4, while rotating the substrate 1 about the normal line in the same manner as described above, thereby forming the second P type ion implanted layer 6 for controlling the threshold voltage (see FIG. 4).

Then, phosphorus ions were implanted as N type impurity ions to the whole surface of the substrate 1 in a dose of $2 \times 10^{10}$ ions/cm$^2$ with an acceleration voltage of about 30 KeV using the gate electrode 4 as a mask in the direction of the normal line of the substrate to form a third impurity ion implanted layer 7 implanted with N type impurity ions for an LDD structure (see FIG. 5). Subsequently, silicon oxide film is deposited all over the surface of the substrate by a CVD method or the like, then a side wall 8 is formed by an anisotropic etching (see FIG. 6). Next, arsenic ions are implanted as N type impurity ions with an acceleration voltage of 40 KeV in a dose of $3 \times 10^{15}$ ions/cm$^2$ to the whole surface of the substrate 1 in the direction of the normal line of the substrate 1 using the gate electrode 4 and the side wall 8 as masks to form a fourth impurity ion implanted layer 9 implanted with N type impurities for forming source/drain regions (see FIG. 7). Then, the third and fourth impurity ion implanted layers 7 and 9 were activated by a thermal treatment at 900° C. in 20 minutes, thereby forming an impurity ion diffusion layer which works as source and drain regions.

Thus, the obtained semiconductor device of the present invention comprises the source and drain regions having a junction region with the substrate to which boron ions are implanted as an impurity ion and two pairs of boron ion implanted regions provided on the inner sides of the source and drain regions. As shown in FIG. 15, concentration distributions of the implanted impurity ions of the opposite conductivity to the substrate are gradually reduced in a vertical direction from the surface of the substrate to the bottom of the source and drain regions at least in two grades, and the concentration distribution of the boron ions are gradually reduced in a horizontal direction from the source and drain regions towards the center of the channel region at least in two grades.

FIGS. 10 to 14 show the characteristics of the obtained semiconductor device.

As is clearly seen from the figures, both of the threshold voltage and the source/drain breakdown voltage are effectively controlled even when the channel length is short.

Therefore, the short channel effect can be inhibited. This is because impurity ions of the same conductivity as the substrate are implanted to different regions for controlling threshold voltage and for source/drain breakdown voltage, respectively.

EXAMPLE 2

Impurity ion implanted layers for controlling the breakdown voltage and for controlling the threshold voltage were formed in a manner similar to Example 1 except that ions were implanted in an oblique direction at a tilt angle of 20° to the substrate, while rotating the substrate about the normal line thereof. Then, source and drain regions were formed in the same manner as in Example 1.

The effect exhibited from the device manufactured by the method for this example was the same as shown in Example 1.

EXAMPLE 3

Ion implanted layers for controlling the breakdown voltage and for controlling the threshold voltage were formed in a manner similar to Example 1 except that ions were implanted with an acceleration voltage of 40 KeV for forming the both layer, while rotating the substrate about the normal line thereof. Then, source and drain regions were formed in the same manner as in Example 1.

The effect exhibited from the device manufactured by the method for this example was the same as shown in Example 1.

EXAMPLE 4

Ion implanted layers for controlling the breakdown voltage and for controlling the threshold voltage were formed in a manner similar to Example 1 except that the dose for controlling the breakdown voltage was $7 \times 10^{12}$ cm$^2$ and $10 \times 10^{12}$ ions/cm$^2$ while rotating the substrate about the normal line thereof. Then, source and drain regions were formed in the same manner as in Example 1.

The effect exhibited from the device manufactured by the method for this example was the same as shown in Example 1.

EXAMPLE 5

Ion implanted layers for controlling the source/drain breakdown voltage and for controlling threshold voltage were formed in a manner similar to Example 1 except that ions are implanted for controlling the threshold voltage in an oblique direction at a tilt angle of 60° to the normal line of the substrate, while rotating the substrate about the normal line thereof. Then, source and drain regions were formed in the same manner as in Example 1.

The effect exhibited from the device manufactured by the method for this example was the same as shown in Example 1.

EXAMPLE 6

Ion implanted layers for controlling the source/drain breakdown voltage and for controlling the threshold voltage were formed in a manner similar to Example 2 except that ions were implanted for controlling the threshold voltage with an acceleration voltage of 40 KeV and 80 KeV, while rotating the substrate about the normal line thereof.

Then, source and drain regions were formed in the same manner as in Example 2.

The effect exhibited from the device manufactured by the method for this example was the same as shown in Example 2.

EXAMPLE 7

Ion implanted layers for controlling the breakdown voltage and for controlling the threshold voltage were formed in a manner similar to Example 1 except that the dose for controlling the threshold voltage was $2\times10^{12}$ cm$^2$ ions/cm$^2$, while rotating the substrate about the normal line thereof. Then, source and drain regions were formed in the same manner as in Example 1.

The effect exhibited from the device manufactured by the method for this example was the same as shown in Example 1.

COMPARATIVE EXAMPLE

After forming a gate electrode in the same manner as Example 1, only the ion implanted layer for controlling the threshold voltage was formed by implanting impurity ions in an oblique direction at a tilt angle of 7° to the normal line of the substrate with a dose of $1\times10^{13}$ and acceleration voltage of 80 KeV. Then, source and drain regions were formed in the same manner as in Example 1.

The characteristics of the device manufactured by this example are also shown in FIGS. 10 to 14.

What we claimed is:

1. A semiconductor device comprising an MOS type field effect transistor comprising:

a semiconductor substrate having a gate oxide film and a gate electrode thereon;

source and drain regions formed of ion implanted regions of opposite conductivity type to the substrate on opposite sides of a channel region; and plural pairs of impurity ion implanted regions having a same conductivity type as the substrate, which comprise:

a first shallow pair of impurity ion implanted regions located in the channel region under the gate electrode, and having a higher impurity concentration than that of the channel region; and a second pair of impurity ion implanted regions provided in a position deeper than the first shallow pair of impurity ion implanted regions and equal in depth or shallower than a depth of said source/drain regions.

2. A semiconductor device according to claim 1, in which the second pair of impurity ion implanted regions has an impurity ion concentration lower than the first pair of impurity ion implanted regions, and the first and the second pair of impurity ion implanted regions have a conductivity greater than the substrate.

3. A semiconductor device according to claim 1, in which concentration distributions of implanted impurity ions of the opposite conductivity type to the substrate are gradually reduced in a vertical direction from the surface of the substrate in the source and drain regions, and a concentration distribution of each of the implanted impurity ion regions of the same conductivity type as the substrate is gradually reduced in a horizontal direction from the source and drain regions towards the center of the channel region.

* * * * *